(12) United States Patent
Huang et al.

(10) Patent No.: US 11,868,868 B2
(45) Date of Patent: Jan. 9, 2024

(54) METHOD FOR IMPLEMENTING ADAPTIVE STOCHASTIC SPIKING NEURON BASED ON FERROELECTRIC FIELD EFFECT TRANSISTOR

(71) Applicant: PEKING UNIVERSITY, Beijing (CN)

(72) Inventors: Ru Huang, Beijing (CN); Jin Luo, Beijing (CN); Tianyi Liu, Beijing (CN); Qianqian Huang, Beijing (CN)

(73) Assignee: Peking University, Beijing (CN)

( * ) Notice: Subject to any disclaimer, the term of this patent is extended or adjusted under 35 U.S.C. 154(b) by 0 days.

(21) Appl. No.: 18/034,287

(22) PCT Filed: Nov. 27, 2020

(86) PCT No.: PCT/CN2020/132032
§ 371 (c)(1),
(2) Date: Apr. 27, 2023

(87) PCT Pub. No.: WO2022/095160
PCT Pub. Date: May 12, 2022

(65) Prior Publication Data
US 2023/0316052 A1 Oct. 5, 2023

(30) Foreign Application Priority Data
Nov. 6, 2020 (CN) .......................... 202011227945.9

(51) Int. Cl.
*G06N 3/049* (2023.01)
*G06N 3/065* (2023.01)
(Continued)

(52) U.S. Cl.
CPC ............. *G06N 3/049* (2013.01); *G06N 3/065* (2023.01); *G11C 11/54* (2013.01); *G11C 11/223* (2013.01)

(58) Field of Classification Search
CPC ...... G06N 3/049; G06N 3/065; G11C 11/223; G11C 11/54
(Continued)

(56) References Cited

U.S. PATENT DOCUMENTS 10,963,776 B2 * 3/2021 Mulaosmanovic ...... G06N 3/06
11,232,824 B1 * 1/2022 Gong ................... G11C 11/2275
(Continued)

FOREIGN PATENT DOCUMENTS

CN 101860357 A 10/2010
CN 103078055 A 5/2013
(Continued)

OTHER PUBLICATIONS

Y. Nishitani, Y. Kaneko, M. Ueda, T. Morie, E. Fujii; Three-terminal ferroelectric synapse device with concurrent learning function for artificial neural networks. Journal of Applied Physics Jun. 15, 2012; 111 (12): 124108. https://doi.org/10.1063/1.4729915 (Year: 2012).*
(Continued)

*Primary Examiner* — James D. Rutten
(74) *Attorney, Agent, or Firm* — Harness, Dickey & Pierce, P.L.C.

(57) ABSTRACT

Disclosed is a method for implementing an adaptive stochastic spiking neuron based on a ferroelectric field effect transistor, relating to the technical field of spiking neurons in neuromorphic computing. Hardware in the method includes a ferroelectric field effect transistor (fefet), an n-type mosfet, and an l-fefet formed by enhancing a polarization degradation characteristic of a ferroelectric material for the ferroelectric field-effect transistor, wherein a series structure of the fefet and the n-type mosfet adaptively modulates a voltage pulse signal transmitted from a synapse. The l-fefet has a gate terminal connected to a source terminal of the fefet to receive the modulated pulse signal, and simulates
(Continued)

integration, leakage, and stochastic spike firing characteristics of a biological neuron, thereby implementing an advanced function of adaptive stochastic spike firing of the neuron.

5 Claims, 1 Drawing Sheet

(51) Int. Cl.
    *G11C 11/54*     (2006.01)
    *G11C 11/22*     (2006.01)

(58) Field of Classification Search
    USPC .......................................................... 706/27
    See application file for complete search history.

(56) References Cited

U.S. PATENT DOCUMENTS

| | | |
|---|---|---|
| 2015/0178619 A1 | 6/2015 | Nishitani et al. |
| 2018/0285721 A1 | 10/2018 | Lee |
| 2019/0005381 A1 | 1/2019 | Li et al. |
| 2019/0012593 A1* | 1/2019 | Obradovic ............. G06N 3/063 |
| 2019/0096463 A1* | 3/2019 | Han .................... G11C 11/2255 |
| 2019/0172539 A1* | 6/2019 | Slesazeck ......... H01L 29/40111 |

FOREIGN PATENT DOCUMENTS

| | | | | |
|---|---|---|---|---|
| CN | 105930903 A | | 9/2016 | |
| CN | 106875003 A | | 6/2017 | |
| CN | 108987409 A | | 12/2018 | |
| CN | 109787592 A | | 5/2019 | |
| CN | 110232440 A | | 9/2019 | |
| CN | 110309908 A | * | 10/2019 | ............. G06N 3/049 |
| CN | 111244270 A | | 6/2020 | |
| CN | 111291877 A | | 6/2020 | |

OTHER PUBLICATIONS

Jerry, M., Dutta, S., Kazemi, A., Ni, K., Zhang, J., Chen, P., Sharma, P., Yu, S., Hu, X.S., Niemier, M.T., & Datta, S. (2018). A ferroelectric field effect transistor based synaptic weight cell. Journal of Physics D: Applied Physics, 51. (Year: 2018).*
Tian et al. "Recent advances, perspectives and challenges in ferroelectric synapses", Jul. 14, 2020, arXiv.org, <arXiv:2007.06914> (Year: 2020).*
Dutta et al. "Supervised Learning in All FeFET-Based Spiking Neural Network: Opportunities and Challenges", Jun. 24, 2020, Frontiers in Neuroscience, Sec. Neuromorphic Engineering, vol. 14—2020, https://doi.org/10.3389/fnins.2020.00634 (Year: 2020).*
Wang Zongwei, et al., "Intelligent chip and device technology for neuromorphic computing," China Science Foundation, 656-662, 2019, Abstract only.
Yanghoa Wang, et al., "Progresses and outlook in neuromorphic devices," Science China Press, vol. 65, No. 10, 904-915, 2020.
Jin Luo, et al., "Capacitor-less Stochastic Leaky-FeFET Neuron of Both Excitatory and Inhibitory Connections for SNN with Reduced Hardware Cost," IEEE, 6.4.1, 122-125, 2019.
C. Chen, et al., "Bio-Inspired Neurons Based on Novel Leaky-FeFET with Ultra-Low Hardware Cost and Advanced Functionality for All-Ferroelectric Neural Network," Symposium on VLSI Technology Digest of Technical Papers, T136-T137, 2019.
Yin Minghui, et al., "Progress and outlook of neuromorphic devices," National Defense Science & Technology, vol. 37, No. 6, Dec. 2016, Abstract only.
S. Dutta, et al., "Biologically Plausible Ferroelectric Quasi-Leaky Integrate and Fire Neuron," Symposium on VLSI Technology Digest of Technical Papers, T140-T141, 2019.
Hai Zhong, et al., "High-performance synaptic transistors for neuromorphic computing," Chin. Phys. B, vol. 29, No. 4, 2020.
Zhao, Lantian, et al., "Research progress of artificial synaptic devices based on ferroelectric materials" Journal of Functional Materals and Devices, vol. 26, No. 3, Jun. 2020, Abstract only.
International Search Report and Written Opinion of the ISA issued in PCT/CN2020/132032, dated Jun. 28, 2021; ISA/CN.
Notification on Grant of Patent Right for Invention issued in CN Application 202011227945.9, dated Apr. 6, 2022.

* cited by examiner

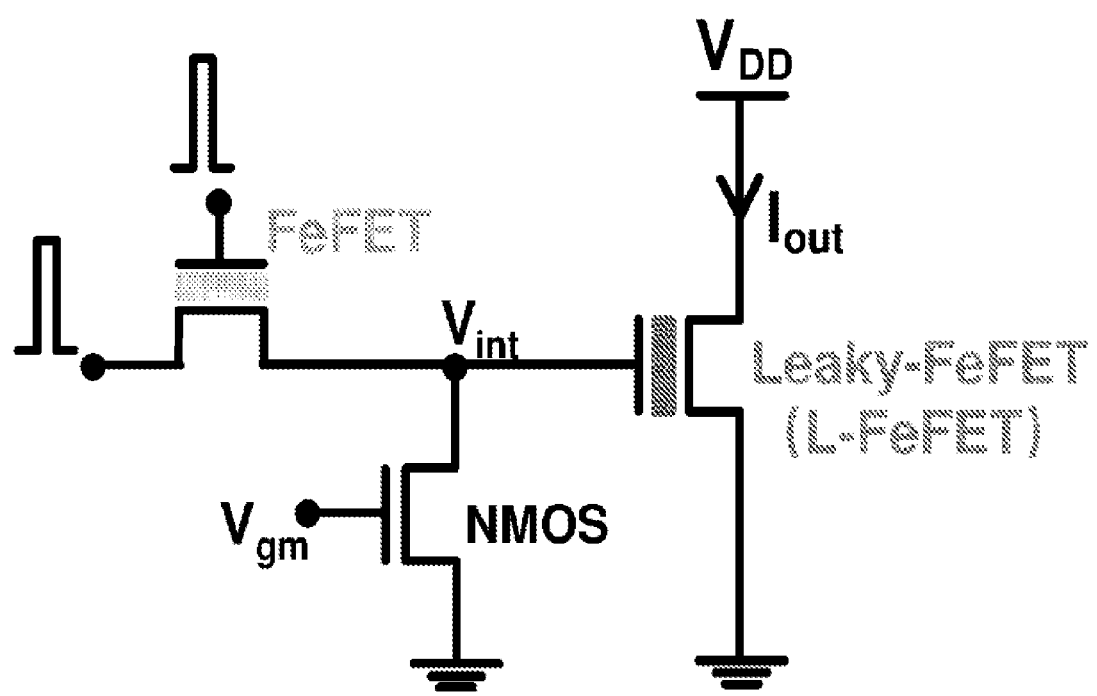

METHOD FOR IMPLEMENTING ADAPTIVE STOCHASTIC SPIKING NEURON BASED ON FERROELECTRIC FIELD EFFECT TRANSISTOR

CROSS-REFERENCE TO RELATED APPLICATIONS

This application is a U.S. National Stage Entry under 35 U.S.C. § 371 of International Patent Application No. PCT/CN2020/132032, entitled METHOD FOR IMPLEMENTING ADAPTIVE STOCHASTIC SPIKING NEURON BASED ON FERROELECTRIC FIELD EFFECT TRANSISTOR, filed Nov. 27, 2020, which claims priority to and the benefit of Chinese Patent Application No. 202011227945.9, entitled METHOD FOR IMPLEMENTING ADAPTIVE STOCHASTIC SPIKING NEURON BASED ON FERROELECTRIC FIELD EFFECT TRANSISTOR, filed with the China National Intellectual Property Administration (CNIPA) on Nov. 6, 2020, the entire disclosures of which are incorporated by reference in their entirety herein.

FIELD OF THE INVENTION

The present disclosure relates to the technical field of spiking neurons in neuromorphic computing, and in particular, to a method for implementing an adaptive stochastic spiking neuron based on a ferroelectric field effect transistor.

BACKGROUND OF THE INVENTION

With vigorous development of information technologies, the human society has entered the era of "data explosion". Exponential growth of data volume every year brings unprecedented pressure to data processing and calculation. Regarding a conventional Von Neumann computing architecture, due to an architecture characteristic of separation of storage and computing, transmission of data between a storage unit and a computing unit may result in a large amount wastes of power consumption and of energy consumption. In the context of today's information society and even the intelligent society with an enormous amount of data, this problem may become more and more serious.

Inspired by a human brain operation mode, researchers proposed a neural network computing architecture, where a highly parallel distributed computing network with computing in memory is constructed based on a connection mode of neuron-synapse-neuron, so that problems of power consumption and energy consumption due to a "memory wall" in the conventional Von Neumann computing architecture may be avoided while improving efficiency of processing complex data. In a classic artificial neural network, a function of the neurons is abstracted as numerical computing: First, input data is summed, and then an output activation value is obtained through an activation function. At present, in image recognition, natural language processing, automatic driving, and other applications, the artificial neural network has shown computational efficiency that exceeds computational efficiency of a conventional universal computing unit. However, compared with a human brain, there are still some problems, such as a long learning and training cycle and high computing hardware overhead. Neuromorphic computing further simulates the human brain based on a neural network computing architecture, and expresses and transfers information in a form of spiking. A constructed spiking neural network has characteristics of being asynchronous and event-driven, which may further narrow a gap between machine intelligence and human brain intelligence, and has advantages such as high energy efficiency, a fast learning speed, and a strong generalization capability.

Different from a neuron in the artificial neural network, a spiking neuron is responsible for integrating input pulse signals and outputting new pulse signals to transfer information, and operates in a form of simulating a biological neuron, having a signal processing process reflected in changes of membrane potential. The spiking neuron has a basic function that may be abstracted as Leaky Integrate-and-Fire (LIF), and is a bionic spiking neuron model which is most widely applied in the neuromorphic computing. In addition to the basic function of integrate-and-fire, the spiking neuron also has an advanced function of stochastic spike firing. Specifically, a number of input pulses, which are integrated for a neuron from a resting state until action potential is generated, is stochastic. The stochasticity helps the spiking neural network explore solution space of a problem.

To completely get rid of a bottleneck of the "memory wall", the neuromorphic computing finally needs to realize hardware of the entire network. At present, many research institutions and enterprises have developed a plurality of neuromorphic chips in hardware implementations of the neuromorphic computing. However, in a prior hardware scheme of the neuromorphic computing, a basic unit of a network, i.e., spiking neuron, is still built basically based on a conventional CMOS circuit, and simulation of a function of the spiking neuron usually depends on a circuit module including several MOSFET devices and capacitors, in which there are problems of large hardware overhead and high circuit energy consumption, which is not conducive to high-density and large-scale integration, and may make the network lose original advantages in power consumption and energy consumption that are brought by an architecture layer. In addition, for resolving widespread optimization problems by using neuromorphic computing hardware, neuronal advanced functions of adaptive stochasticity needs to be realized, so that the spiking neural network may explore the solution space of the problem and gradually converge to an optimal solution. However, an implementation based on the conventional CMOS circuit generally needs to introduce large additional hardware overhead.

SUMMARY OF THE INVENTION

Regarding the foregoing problems existing in the prior art, the present disclosure provides a method for implementing an adaptive stochastic spiking neuron based on a ferroelectric field effect transistor. Compared with an implementation based on a conventional MOSFET, according to the present disclosure, hardware overhead may be significantly reduced on a premise of realizing an advanced function of adaptive stochasticity necessary for a spiking neural network to resolve optimization problems.

Technical solutions provided in the present disclosure are as follows.

A method for implementing an adaptive stochastic spiking neuron based on a ferroelectric field effect transistor is provided. Hardware includes a general ferroelectric field effect transistor (FeFET), an N-type MOSFET (NMOS), and an L-FeFET formed by enhancing a polarization degradation characteristic of a ferroelectric material of the ferroelectric field-effect transistor (refer to FIG. 1). The general FeFET has a gate terminal and a drain terminal receiving input voltage pulses transmitted from a synapse, respectively, and a source terminal connected to a drain terminal of the N-type MOSFET. The N-type MOSFET has a source terminal connected to a GND and a gate terminal with a bias voltage lower than a threshold voltage thereof. A series structure of the general FeFET and the N-type MOSFET adaptively modulates a voltage pulse signal transmitted from the synapse. The L-FeFET has a gate terminal connected to the source terminal of the general FeFET to receive the modulated pulse signal. The L-FeFET simulates integration, leakage, and stochastic spike firing characteristics of a biological neuron. The L-FeFET has a source terminal connected to the GND and a drain terminal serving as an output terminal to generate a current pulse. The L-FeFET is configured to simulate integration, leakage, and spike firing functions of the biological neuron while guaranteeing an advanced function of stochastic spike firing of the neuron by intrinsic stochasticity of ferroelectric polarization reversal, so that the adaptive stochastic spiking neuron is implemented.

According to the present disclosure, polarization of the general ferroelectric field effect transistor FeFET is gradually reversed under an action of a gate voltage pulse, and a threshold voltage of the FeFET is regulated, so as to regulate a characteristic of threshold voltage loss of the FeFET that serves as a transmission tube, and realize adaptive amplitude modulation of the voltage pulse received by the neuron. A function of regulatable stochasticity of a hardware neuron is implemented by using a voltage-dependent stochastic polarization reversal characteristic and a polarization intensity degradation characteristic of the L-FeFET with the enhanced polarization degradation characteristic under the action of the gate voltage pulse. By combination of the two characteristics of the ferroelectric field effect transistor, an adaptive stochastic spiking neuron of the hardware is implemented.

According to the present disclosure, stochasticity of a neuron may be regulated by regulating amplitude and width of an input voltage pulse of the neuron.

According to the present disclosure, the series structure of the FeFET and the N-type MOSFET adaptively regulates the amplitude of the voltage pulse transmitted to L-FeFET as a number of input pulses increases, to implement an advanced function of adaptive stochastic spike firing of the neuron.

The general FeFET used by the adaptive stochastic spiking neuron according to the present disclosure has the following characteristic: When agate voltage pulse is applied, an integration effect is shown. In other words, by applying a voltage pulse to a gate, a threshold voltage of a FeFET device may be regulated, so that channel conductance of the device may be regulated. The L-FeFET with the enhanced polarization degradation characteristics used in the present disclosure has the following characteristics: When the gate voltage pulse is applied, a significant integration effect is shown. In other words, ferroelectric polarization is reversed gradually, with the stochastic characteristic. Channel conductance of an L-FeFET device is regulated through polarization, and when there is no gate voltage pulse, degradation of an integrated state, that is, degradation of ferroelectric polarization intensity, is shown, representing a leakage characteristic. The foregoing FeFET and L-FeFET may be made of conventional ferroelectric materials such as perovskite-type ferroelectric (PZT, BFO, or SBT) or ferroelectric polymers (P(VDF-TrFE)), or doped $HfO_2$ ferroelectric materials such as Zr-doped $HfO_2$ (HZO), Al-doped $HfO_2$ (HfALO), Si-doped $HfO_2$, Y-doped $HfO_2$, and the like; and may be any kind of ferroelectric field effect transistor devices having the foregoing typical characteristics based on an MFMIS structure, an MFIS structure, or an MFS structure.

The adaptive stochastic spiking neuron based on a ferroelectric field effect transistor in the present disclosure has beneficial effects and corresponding principles as follows.

1. The adaptive stochastic spiking neuron based on the ferroelectric field effect transistor according to the present disclosure implements the advanced function of stochastic spike firing of the biological neuron by using a characteristic that the ferroelectric polarization reversal of the ferroelectric field effect transistor is stochastic under the action of the gate voltage pulse. Compared with an implementation based on a conventional CMOS circuit, hardware overhead is significantly reduced, and no additional circuit is required to implement a stochastic firing function of the spiking neuron.
2. The adaptive stochastic spiking neuron based on a ferroelectric field effect transistor according to the present disclosure implements an advanced function of regulatable stochasticity of the neuron by using a characteristic that stochasticity of the ferroelectric polarization reversal in the ferroelectric field effect transistor changes with the amplitude and the width of the received gate voltage pulse.
3. According to the adaptive stochastic spiking neuron based on a ferroelectric field effect transistor of the present disclosure, by using the characteristic that the polarization of the general FeFET is reversed under the action of the gate voltage to modulate the channel conductance, only one general FeFET and one NMOS are required to perform adaptive amplitude modulation on a pulse transmitted from a previous-stage synapse, so that an advanced function of adaptive stochasticity of the spiking neuron of the present disclosure is implemented, which helps the spiking neural network with the hardware resolve optimization problems. Compared with an implementation based on a conventional CMOS, according to the present disclosure, hardware costs are significantly reduced, and no additional control is required to implement a function of stochastically and adaptively regulating the spike firing of the neuron.

BRIEF DESCRIPTION OF THE DRAWINGS

FIG. 1 is a schematic diagram of an adaptive stochastic spiking neuron based on a ferroelectric field effect transistor according to the present disclosure.

DETAILED DESCRIPTION OF THE EMBODIMENTS

A method for implementing an adaptive stochastic spiking neuron based on a ferroelectric field effect transistor provided in the present disclosure is further described below through an embodiment with reference to the accompanying drawings.

In this embodiment, a general ferroelectric field effect transistor (FeFET) is made of an amorphous $Hf_{0.5}Zr_{0.5}O_2$ ferroelectric material; and a Leaky-FeFET (L-FeFET) with an enhanced polarization degradation characteristic is made of a partially polarized $Hf_{0.5}Zr_{0.5}O_2$ ferroelectric material.

As shown in FIG. 1, this example is directed to an adaptive stochastic spiking neuron based on a ferroelectric field effect transistor, including a general FeFET, an NMOS, and an L-FeFET with an enhanced polarization degradation characteristic. The general FeFET has a gate terminal and a drain terminal respectively receiving voltage pulses $V_{in}$ input from a synapse, and a source terminal connected to a drain terminal of the NMOS. The NMOS has a source terminal connected to a GND, and a gate terminal connected to a fixed voltage $V_{gm}$ lower than a threshold voltage thereof. A series structure of the general FeFET and the N-type MOSFET modulates, by dynamic voltage division, a voltage pulse signal transmitted from the synapse, to generate an intermediate signal $V_{int}$, which is applied to a gate terminal of the L-FeFET. The L-FeFET has a source terminal connected to the GND, and a drain terminal connected to a power supply voltage $V_{DD}$. A channel current of the L-FeFET serves as a current output $I_{out}$ of the neuron. The L-FeFET simulates integration, leakage, and stochastic spike firing characteristics of a biological neuron.

The present invention has beneficial effects which are described according to this embodiment.

1. In an initial state, the L-FeFET has relatively high $V_{TH}$. When a previous-stage FeFET transmits a voltage pulse $V_{int}$ with a constant amplitude to be applied to an L-FeFET gate, an L-FeFET device cannot be fully turned on, with a still smaller channel conductance and without pulse output. Meanwhile, the pulse $V_{int}$ may result in a forward reversal of ferroelectric polarization, where this process is stochastic. Continuous integration of polarization may cause the device to have lower and lower $V_{TH}$. When the $V_{TH}$ of the L-FeFET is low enough, an input voltage pulse may make the device be fully turned on, to form a current pulse $I_{out}$. A counting is performed on a number of input pulses required to be integrated for the spike firing of the L-FeFET from the initial state. Counting results show a certain distribution characteristic. In view of the above, the adaptive stochastic spiking neuron based on the ferroelectric field effect transistor according to the present disclosure achieves a stochastic spike firing characteristic of the biological neuron by using an intrinsic stochastic characteristic of a ferroelectric polarization reversal.

2. When voltage pulse trains with different amplitudes and pulse widths are applied to the gate terminal of the L-FeFET, statistics about distribution characteristics of a number of input pulses required to be integrated for the spike firing of the L-FeFET from the initial state are performed, where the amplitude and the width of the pulse voltage may be used to regulate a mean value and a variance of the distribution, that is, stochasticity of spike firing of the neuron may be regulated. In view of the above, the adaptive stochastic spiking neuron based on the ferroelectric field effect transistor according to the present disclosure may achieve an advanced function of regulatable stochasticity of the neuron by using a characteristic that stochasticity of the ferroelectric polarization reversal in the ferroelectric field effect transistor changes with the amplitude and the width of the received gate voltage pulse.

3. In the initial state, the general FeFET has a relatively high $V_{TH}$, and a bias voltage $V_{gm}$ of the gate terminal of the NMOS is lower than the $V_{TH}$ of the NMOS. When the gate terminal and the drain terminal of the FeFET receive the input voltage pulse transmitted from the synapse, the FeFET serves as a feed-forward transmission tube and transmits a voltage signal of the drain terminal to the source terminal, to generate an intermediate modulation signal $V_{int}$. Moreover, the FeFET has a threshold loss effect during voltage pulse transmission. Meanwhile, the voltage pulse of the gate terminal of the FeFET causes the ferroelectric polarization to be gradually reversed and maintained, and the $V_{TH}$ of the FeFET decreases gradually. As a result, an amount of threshold loss during transmission of the input pulse by the FeFET gradually decreases, and pulse amplitude of the intermediate modulation signal $V_{int}$ gradually increases and approaches the amplitude of the input voltage pulse of the drain terminal of the FeFET. As integrative time of receiving the voltage pulse transmitted from the previous-stage synapse increases, the amplitude of the voltage pulse $V_{int}$ applied to the L-FeFET gate increases adaptively, so that the stochasticity of spike firing of the neuron is adaptively regulated. In view of the above, for the adaptive stochastic spiking neuron based on a ferroelectric field effect transistor according to the present disclosure, only one FeFET, one NMOS, and one L-FeFET are required to implement an advanced function of adaptive stochastic spike firing. Compared with an implementation based on a conventional CMOS, according to the present disclosure, hardware overhead is significantly reduced, and no additional control circuit is required to implement a function of adaptively regulating of stochasticity of the spike firing of the neuron.

Finally, it should be noted that the embodiments are disclosed for helping further understanding of the present disclosure. A person skilled in the art may understand that various replacements and modifications are possible without departing from the spirit and the scope of the present disclosure and the appended claims. Therefore, the present disclosure should not be limited to the contents disclosed in the embodiments. The protection scope of the present disclosure is subject to the scope defined in the claims.

What is claimed is:

1. A method for implementing an adaptive stochastic spiking neuron based on a ferroelectric field effect transistor, wherein hardware comprises the ferroelectric field effect transistor (FeFET), an N-type MOSFET, and a Leaky-FeFET (L-FeFET) with an enhanced polarization degradation characteristic, wherein the FeFET has a gate terminal and a drain terminal receiving voltage pulses input from a synapse, respectively, and a source terminal connected to a drain terminal of the N-type MOSFET, wherein a source terminal of the N-type MOSFET is connected to a GND, and a gate terminal of the N-type MOSFET is biased at a fixed voltage lower than a threshold voltage thereof, wherein a series structure of the FeFET and the N-type MOSFET adaptively modulates a voltage pulse signal transmitted from the synapse, and wherein the L-FeFET has a gate terminal connected to the source terminal of the FeFET to receive the modulated pulse signal, a source terminal connected to the GND and a drain terminal serving as an output terminal to generate a current pulse, the L-FeFET being configured to simulate integration, leakage, and spike firing functions of a biological neuron while guaranteeing a function of stochastic spike firing of the neuron by intrinsic stochasticity of ferroelectric polarization reversal, so that the adaptive stochastic spiking neuron is implemented.

2. The method for implementing the adaptive stochastic spiking neuron based on the ferroelectric field effect transistor according to claim 1, wherein stochasticity of a neuron circuit is regulated by regulating amplitude and width of the input voltage pulse of the neuron circuit.

3. The method for implementing the adaptive stochastic spiking neuron based on the ferroelectric field effect transistor according to claim 1, wherein the series structure of the FeFET and the N-type MOSFET adaptively regulates the amplitude of the voltage pulse transmitted to L-FeFET as a number of input pulses increases.

4. The method for implementing the adaptive stochastic spiking neuron based on the ferroelectric field effect transistor according to claim 1, wherein the FeFET and the L-FeFET are ferroelectric field effect transistors based on an MFMIS structure, an MFIS structure, or an MFS structure.

5. The method for implementing the adaptive stochastic spiking neuron based on the ferroelectric field effect transistor according to claim 1, wherein the FeFET and the L-FeFET are made of a perovskite-type ferroelectric material, a ferroelectric polymer material, or a $HfO_2$ doped ferroelectric material.

* * * * *